(12) United States Patent
Tsai

(10) Patent No.: US 11,551,954 B2
(45) Date of Patent: Jan. 10, 2023

(54) ADVANCED PROCESS CONTROL SYSTEM

(71) Applicant: NANYA TECHNOLOGY CORPORATION, New Taipei (TW)

(72) Inventor: Ping-Nan Tsai, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 632 days.

(21) Appl. No.: 16/691,519

(22) Filed: Nov. 21, 2019

(65) Prior Publication Data

US 2021/0159103 A1 May 27, 2021

(51) Int. Cl.
*H01L 21/67* (2006.01)
*H01L 21/66* (2006.01)

(52) U.S. Cl.
CPC .. *H01L 21/67276* (2013.01); *H01L 21/67253* (2013.01); *H01L 22/26* (2013.01)

(58) Field of Classification Search
CPC ......... H01L 21/67276; H01L 21/67253; H01L 22/26
See application file for complete search history.

(56) References Cited

U.S. PATENT DOCUMENTS

| | | | | |
|---|---|---|---|---|
| 6,442,496 | B1 * | 8/2002 | Pasadyn | H01L 21/67276 702/82 |
| 6,901,340 | B1 * | 5/2005 | Pasadyn | G05B 23/0275 702/84 |
| 6,947,804 | B1 * | 9/2005 | Pak | G05B 19/41865 700/121 |
| 2002/0069349 | A1 * | 6/2002 | Toprac | G05B 19/41875 700/121 |
| 2004/0243268 | A1 * | 12/2004 | Hsieh | G06Q 10/06 700/108 |
| 2005/0033467 | A1 | 2/2005 | Purdy | |

(Continued)

FOREIGN PATENT DOCUMENTS

| | | |
|---|---|---|
| CN | 101464633 | 6/2009 |
| CN | 101963802 | 2/2011 |

(Continued)

OTHER PUBLICATIONS

"Office Action of China Counterpart Application", dated May 26, 2022, p. 1-p. 6.

(Continued)

*Primary Examiner* — Nathan W Ha
(74) *Attorney, Agent, or Firm* — JCIPRNET

(57) ABSTRACT

An advanced process control system including a first process tool, a second process tool, and a measurement tool is provided. The first processing tool is configured to process each of a plurality of wafers by one of a plurality of first masks, and provide a first process timing data. The second processing tool is configured to process the wafer processing by the first process tool by one of a plurality of second masks to provide a plurality of works. The second process tool provides a measurement trigger signal according to the first process timing data. The measuring tool is configured to determine whether to perform a measuring operation on each works in response to the measurement trigger signal, and correspondingly provide a measurement result.

14 Claims, 2 Drawing Sheets

(56) References Cited

U.S. PATENT DOCUMENTS

| | | | |
|---|---|---|---|
| 2006/0058979 A1* | 3/2006 | Markle | H01L 21/67276 |
| | | | 702/155 |
| 2010/0249974 A1 | 9/2010 | Fei et al. | |
| 2011/0270574 A1* | 11/2011 | Cruse | H01L 21/67276 |
| | | | 702/176 |
| 2014/0065733 A1 | 3/2014 | Ausschnitt | |
| 2017/0221741 A1* | 8/2017 | Buhl | G05B 19/4184 |
| 2017/0242425 A1 | 8/2017 | Buhl et al. | |
| 2019/0025799 A1* | 1/2019 | Nakayama | G05B 19/418 |
| 2019/0198335 A1* | 6/2019 | Mochizuki | H01L 21/3065 |
| 2020/0103769 A1* | 4/2020 | Chen | B08B 1/00 |
| 2021/0325852 A1* | 10/2021 | Hashimoto | H01L 21/67276 |
| 2021/0335638 A1* | 10/2021 | Manassen | H01L 21/67276 |

FOREIGN PATENT DOCUMENTS

| | | |
|---|---|---|
| CN | 106653639 | 5/2017 |
| TW | 200745895 | 12/2007 |

OTHER PUBLICATIONS

"Office Action of Taiwan Counterpart Application", dated Dec. 25, 2020, pp. 1-5.

* cited by examiner

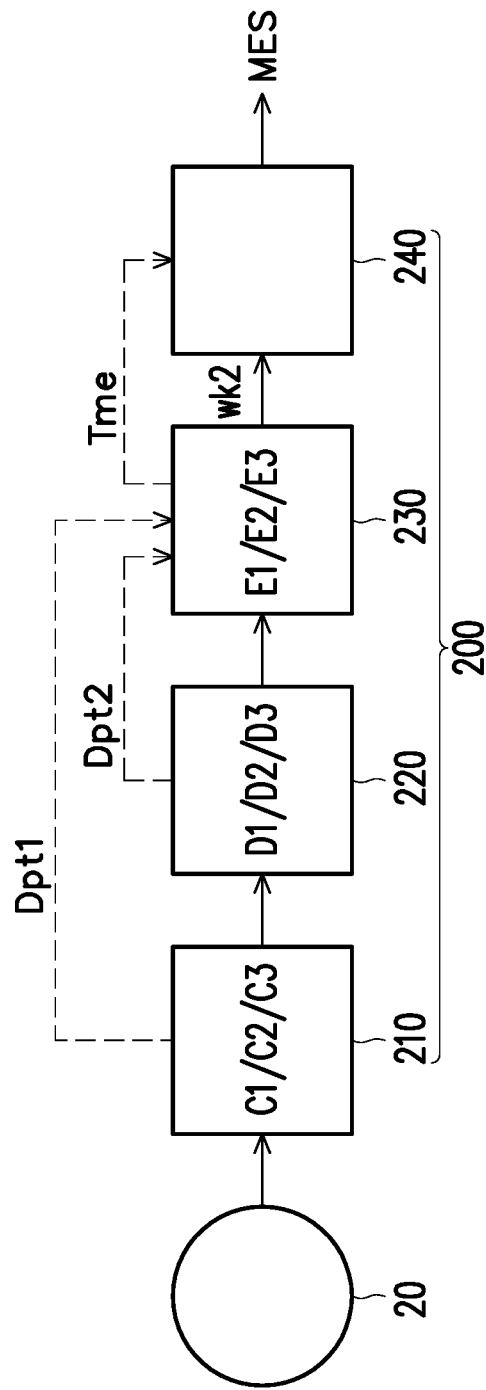

ADVANCED PROCESS CONTROL SYSTEM

BACKGROUND

Technical Field

The invention relates to a control system, and particularly relates to an advanced process control system.

Description of Related Art

Advanced Process Control (APC) system is a new generation of process control system, which defines a relationship between layers to improve a yield and reduce production cost. The APC is based on a traditional Statistical Process Control (SPC) added with tool parameters provided by process equipment for implementing larger-scale monitoring, and then a process analysis module predicts a process result to achieve an effect of improving the process.

SUMMARY

The invention is directed to an advanced process control system, which is adapted to improve a measurement rate of works.

The invention provides an advanced process control system including a first process tool, a second process tool, and a measurement tool. The first process tool is configured to process each of a plurality of wafers by one of a plurality of first masks, and provide a first process timing data. The second process tool is configured to process each of the wafers processed by the first process tool by one of a plurality of second masks to provide a plurality of works. The second process tool provides a measurement trigger signal according to the first process timing data. The measurement tool is configured to determine whether to perform a measuring operation on each work in response to the measurement trigger signal, and correspondingly provide a measurement result.

Based on the above description, in the advanced process control system of the embodiment of the invention, the second process tool receives the first process timing data from the first process tool, so as to provide the measurement trigger signal according to the first process timing data to determine whether to perform the measuring operation on each work. In this way, the measurement rate of the works is improved.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a timing schematic diagram of time grouping according to an embodiment of the invention.

FIG. 4 is a system schematic diagram of an advanced process control system according to another embodiment of the invention.

DESCRIPTION OF THE EMBODIMENTS

Figure 1:
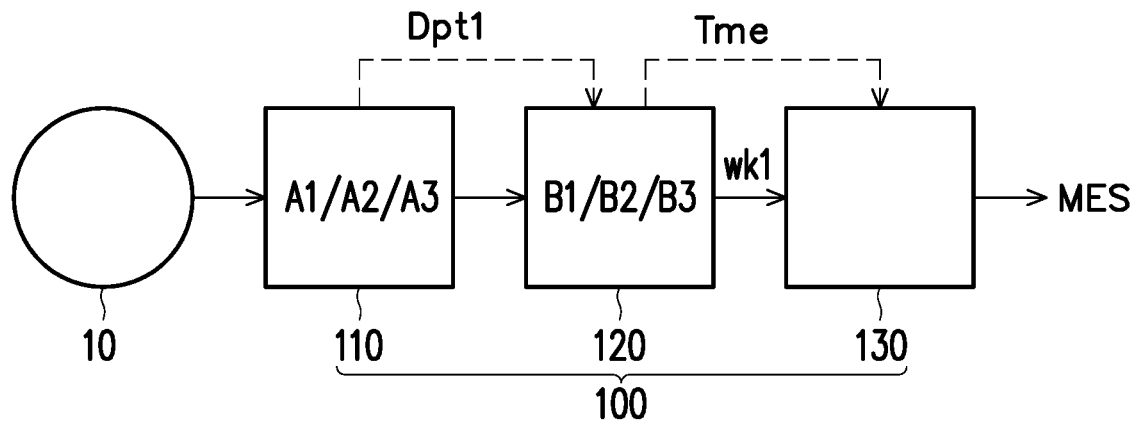
FIG. 1 is a system schematic diagram of an advanced process control system according to an embodiment of the invention.

FIG. 1 is a system schematic diagram of an advanced process control system according to an embodiment of the invention. Referring to FIG. 1, in the embodiment, the advanced process control system 100 includes a first process tool 110, a second process tool 120 and a measurement tool 130, where solid arrows are used to indicate an order in which a wafer 10 is processed among the first process tool 110, the second process tool 120 and the measurement tool 130, and it is not limited whether the wafer 10 is processed by other tools among the first process tool 110, the second process tool 120 and the measurement tool 130.

The first process tool 110 is configured to process each of a plurality of wafers 10 by one of a plurality of different first masks A1-A3, and provide a first process timing data Dpt1 to the second process tool 120, where the first process timing data Dpt1 indicates a time breakpoint of each of the first masks A1-A3, i.e. indicates the mask executed by the first process tool 110 at each time.

The second process tool 120 is configured to process each of the wafers 10 processed by the first process tool 110 (i.e. processed by one of the first masks A1-A3) by one of a plurality of different second masks B1-B3 to provide a plurality of works wk1, where the second process tool 120 provides a measurement trigger signal Tme to the measurement tool 130 according to the first process timing data Dpt1.

The measurement tool 130 is configured to determine whether to perform a measuring operation on each of the works wk1 in response to the measurement trigger signal Tme, and correspondingly provide a measurement result MES. In other words, only when the measurement trigger signal Tme indicates to perform the measuring operation (for example, the measurement trigger signal Tme is in an enable state), the measurement tool 130 performs the measuring operation on the incoming work wk1; and when the measurement trigger signal Tme does not indicate to perform the measuring operation (for example, the measurement trigger signal Tme is in a disable state), the measurement tool 130 does not perform the measuring operation on the incoming work wk1.

In an embodiment of the invention, the second process tool 120 learns execution timings of the first masks A1-A3 according to the first process timing data Dpt1, and learns (or predicts) the first mask (for example, A1-A3) and the second mask (for example, B1-B3) executed on each of the works wk1 with reference of the second masks B1-B3 to be executed by itself. Then, the second process tool 120 performs classification according to the first masks (for example, A1-A3) and the second masks (for example, B1-B3) executed on the works wk1, for example, the works wk1 with the same first mask (for example, A1-A3) and the same second mask (for example, B1-B3) are classified into a same category. Moreover, the second process tool 120 counts the number of each category.

When a corresponding measurement threshold is individually reached, the second process tool 120 selects at least one work wk1 periodically or randomly from a plurality of works wk1 of the same category for measurement. In order words, the measurement trigger signal Tme is enabled when the number of the works wk1 (i.e., the first works) processed by the same first mask (for example, A1-A3) and the same second mask (for example, B1-B3) in these works wk1 reaches the measurement threshold, and at least one first work selected from the first works is to be provided to the measurement tool 130. The number of the selected at least one first work is proportional to a ratio of the number of the first works and the measurement threshold, so as to achieve (or approach) an expected measurement rate.

In an embodiment of the invention, the first process tool 110 may respectively form corresponding first photoresist patterns on the wafers 10 through the first masks A1-A3, and the second process tool 120 respectively form corresponding second photoresist patterns on the wafers 10 through the second masks B1-B3. Moreover, the first masks A1-A3 and the second masks B1-B3 may be respectively a reticle.

Figure 2:
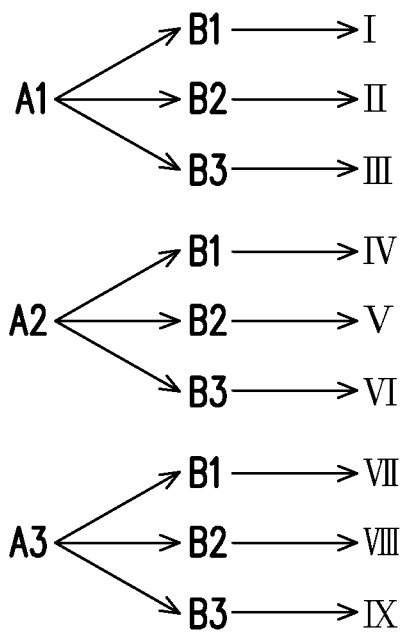
FIG. 2 is a classification schematic diagram of time grouping according to an embodiment of the invention.

FIG. 2 is a schematic diagram of classification of time grouping according to an embodiment of the invention. FIG. 3 is a schematic diagram of timing of time grouping according to an embodiment of the invention. Referring to FIG. 1 to FIG. 3, in the embodiment, the works wk1 may be substantially classified into 9 categories (i.e. categories I-IX). Moreover, the second process tool 120 may deduce (or predict) the category of each work wk1 in timing, count the number of each category, and compare the number of each category with the corresponding measurement threshold. It is assumed that each of the categories I-IX is set to 4, and the eligible categories are I and II with the number of 4. Therefore, the second process tool 120 may respectively select one category I and one category II (i.e. two works wk1) for measurement, shown as the categories I and II with bottom lines. According to the selected categories I and II, the second process tool 120 may enable the measurement trigger signal Tme when the works wk1 corresponding to the selected categories I and II are to be provided to the measurement tool 130, so as to measure the works wk1 corresponding to the selected categories I and II.

FIG. 4 is a system schematic diagram of an advanced process control system according to another embodiment of the invention. Referring to FIG. 4, in the embodiment, the advanced process control system 200 includes a first process tool 210, a second process tool 220, a third process tool 230 and a measurement tool 240, where solid arrows are used to indicate an order in which a wafer 20 is processed among the first process tool 210, the second process tool 220, the third process tool 230 and the measurement tool 240, and it is not limited whether the wafer 20 is processed by other tools among the first process tool 210, the second process tool 220, the third process tool 230 and the measurement tool 240.

The first process tool 210 is configured to process each of a plurality of wafers 20 by one of a plurality of different first masks C1-C3, and provide a first process timing data Dpt1 to the third process tool 230, where the first process timing data Dpt1 indicates a time breakpoint of each of the first masks C1-C3, i.e. indicates the mask executed by the first process tool 210 at each time.

The second process tool 220 is configured to process each of the wafers 20 processed by the first process tool 210 (i.e. processed by one of the first masks C1-C3) by one of a plurality of different second masks D1-D3, and provide a second process timing data Dpt2 to the third process tool 230, where the second process timing data Dpt2 indicates a time breakpoint of each of the second masks D1-D3, i.e. indicates the mask executed by the second process tool 220 at each time.

The third process tool 230 is configured to process each of the wafers 20 processed by the second process tool 220 (i.e. processed by one of the second masks D1-D3) by one of a plurality of different third masks E1-E3 to provide a plurality of works wk2, where the third process tool 230 provides a measurement trigger signal Tme to the measurement tool 240 according to the first process timing data Dpt1 and the second process timing data Dpt2.

The measurement tool 240 is configured to determine whether to perform a measuring operation on each of the works wk2 in response to the measurement trigger signal Tme, and correspondingly provide a measurement result IVIES. In other words, only when the measurement trigger signal Tme indicates to perform the measuring operation (for example, the measurement trigger signal Tme is in the enable state), the measurement tool 240 performs the measuring operation on the incoming work wk2; and when the measurement trigger signal Tme does not indicate to perform the measuring operation (for example, the measurement trigger signal Tme is in the disable state), the measurement tool 240 does not perform the measuring operation on the incoming work wk2.

In an embodiment of the invention, the third process tool 230 learns execution timings of the first masks C1-C3 and the second masks D1-D3 according to the first process timing data Dpt1 and the second process timing data Dpt2, and learns (or predicts) the first mask (for example, C1-C3), the second mask (for example, D1-D3) and the third mask (for example, E1-E3) executed on each of the works wk2 with reference of the third masks E1-E3 to be executed by itself. Then, the third process tool 230 performs classification according to the first masks (for example, C1-C3), the second masks (for example, D1-D3) and the third masks (for example, E1-E3) executed on the works wk2, for example, the works wk2 with the same first mask (for example, C1-C3), the same second mask (for example, D1-D3) and the same third mask (for example, E1-E3) are classified into a same category. Moreover, the third process tool 230 counts the number of each category.

When a corresponding measurement threshold is individually reached, the third process tool 230 selects at least one work wk2 periodically or randomly from a plurality of works wk2 of the same category for measurement. In order words, the measurement trigger signal Tme is enabled when the number of the works wk2 (i.e., the first works) processed by the same first mask (for example, C1-C3), the same second mask (for example, D1-D3) and the same third mask (for example, E1-E3) in these works wk2 reaches the measurement threshold, and at least one first work selected from the first works is to be provided to the measurement tool 240. The number of the selected at least one first work is proportional to a ratio of the number of the first works and the measurement threshold, so as to achieve (or approach) an expected measurement rate.

In an embodiment of the invention, the first process tool 210 may respectively form corresponding first photoresist patterns on the wafers 20 through the first masks C1-C3, the second process tool 220 respectively form corresponding second photoresist patterns on the wafers 20 through the second masks D1-D3, and the third process tool 230 respectively form corresponding third photoresist patterns on the wafers 20 through the third masks E1-E3. Moreover, the first masks C1-C3, the second masks D1-D3 and the third masks E1-E3 may be respectively a reticle.

In the aforementioned embodiments, the number of the process tools of the advanced process control systems is based on 2 and 3, but in other embodiments, the number of the process tools may be 3 or more. Moreover, when the number of the process tools is 3 or more, the final process tool may receive 2 or more process timing data to determine (or deduce) the timing that the process tool of the previous layer executes the mask, and classify the works and count the number of each category, so as to determine whether to perform measuring operation on each work. The measured works of each category may be related to a ratio of the corresponding measurement threshold and the counted number to achieve (or approach) the expected measurement rate.

In summary, in the advanced process control system of the embodiment of the invention, the second process tool receives the first process timing data from the first process tool, so as to provide the measurement trigger signal according to the first process timing data to determine whether to perform the measuring operation on each work. In this way, the measurement rate of the works is improved.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. An advanced process control system, comprising:
    a first process tool, configured to process each of a plurality of wafers by one of a plurality of first masks, and providing a first process timing data;
    a second process tool, configured to process each of the plurality of wafers processed by the first process tool by one of a plurality of second masks to provide a plurality of works, wherein the second process tool provides a measurement trigger signal according to the first process timing data; and
    a measurement tool, configured to determine whether to perform a measuring operation on each of the plurality of works in response to the measurement trigger signal, and correspondingly providing a measurement result,
    wherein the measurement trigger signal is enabled when the number of a plurality of first works processed by the same first mask and the same second mask in the plurality of works reaches a measurement threshold and at least one first work selected from the plurality of first works is to be provided.

2. The advanced process control system as claimed in claim 1, wherein the number of the selected at least one first work is proportional to a ratio of the number of the first works and the measurement threshold.

3. The advanced process control system as claimed in claim 1, wherein the first process timing data indicates a time breakpoint of each of the plurality of first masks.

4. The advanced process control system as claimed in claim 1, wherein the first process tool respectively forms corresponding first photoresist patterns on the plurality of wafers through the plurality of first masks.

5. The advanced process control system as claimed in claim 1, wherein the second process tool respectively forms corresponding second photoresist patterns on the plurality of wafers through the plurality of second masks.

6. The advanced process control system as claimed in claim 1, wherein the plurality of first masks and the plurality of second masks are respectively a reticle.

7. The advanced process control system as claimed in claim 1, further comprising:
    a third process tool, configured to process each of the plurality of wafers processed by the first process tool by one of a plurality of third masks before the second process tool, and providing a second process timing data,
    wherein the second process tool provides the measurement trigger signal according to the first process timing data and the second process timing data.

8. The advanced process control system as claimed in claim 7, wherein the measurement trigger signal is enabled when the number of a plurality of second works processed by the same first mask, the same third mask and the same second mask in the plurality of works reaches a measurement threshold, and at least one second work selected from the plurality of second works is to be provided.

9. The advanced process control system as claimed in claim 8, wherein the number of the selected at least one second work is proportional to a ratio of the number of the plurality of second works and the measurement threshold.

10. The advanced process control system as claimed in claim 7, wherein the second process timing data indicates a time breakpoint of each of plurality of the third masks.

11. The advanced process control system as claimed in claim 7, wherein the second process tool respectively forms corresponding third photoresist patterns on the plurality of wafers through the plurality of third masks.

12. The advanced process control system as claimed in claim 7, wherein the plurality of third masks are different from each other.

13. The advanced process control system as claimed in claim 1, wherein the plurality of first masks are different from each other.

14. The advanced process control system as claimed in claim 1, wherein the plurality of second masks are different from each other.

* * * * *